US011322185B2

(12) United States Patent
Chen et al.

(10) Patent No.: US 11,322,185 B2
(45) Date of Patent: *May 3, 2022

(54) ACTIVE RANDOM ACCESS MEMORY

(71) Applicant: Taiwan Semiconductor Manufacturing Company Limited, Hsinchu (TW)

(72) Inventors: Hsin-Cheng Chen, Hsinchu (TW); Jung-Rung Jiang, Tao-Yuan (TW); Yen-Hao Huang, Hsinchu County (TW)

(73) Assignee: Taiwan Semiconductor Manufacturing Company Limited, Hsinchu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 17/117,261

(22) Filed: Dec. 10, 2020

(65) Prior Publication Data

US 2021/0090618 A1 Mar. 25, 2021

Related U.S. Application Data

(63) Continuation of application No. 15/341,372, filed on Nov. 2, 2016, now Pat. No. 10,867,642.

(60) Provisional application No. 62/337,421, filed on May 17, 2016.

(51) Int. Cl.
| | |
|---|---|
| *G11C 7/10* | (2006.01) |
| *G11C 11/418* | (2006.01) |
| *G06F 12/00* | (2006.01) |
| *G11C 11/419* | (2006.01) |
| *G06F 12/02* | (2006.01) |
| *G11C 7/22* | (2006.01) |

(52) U.S. Cl.
CPC ........ *G11C 7/1072* (2013.01); *G06F 12/0215* (2013.01); *G11C 7/1018* (2013.01); *G11C 7/222* (2013.01); *G11C 11/418* (2013.01); *G11C 11/419* (2013.01); *G06F 2212/1016* (2013.01); *G11C 2207/229* (2013.01); *G11C 2207/2281* (2013.01)

(58) Field of Classification Search
CPC ...... G06F 12/00; G11C 7/1072; G11C 11/418
See application file for complete search history.

(56) References Cited

U.S. PATENT DOCUMENTS

| | | |
|---|---|---|
| 3,090,945 A | 5/1963 | Brandenburg |
| 5,319,768 A | 6/1994 | Rastegar |
| 5,513,143 A | 4/1996 | McClure |

(Continued)

*Primary Examiner* — David E Martinez
(74) *Attorney, Agent, or Firm* — Jones Day

(57) ABSTRACT

Systems and methods for processing commands at a random access memory. A series of commands are received to read data from the random access memory or to write data to the random access memory. The random access memory can process commands at a first rate when the series of commands matches a pattern, and at a second, slower, rate when the series of commands does not match the pattern. A determination is made as to whether the series of commands matches the pattern based on at least a current command and a prior command in the series of commands. A ready signal is asserted when said determining determines that the series of commands matches the pattern, where the random access memory is configured to receive and process commands faster than the second rate when the pattern is matched and the ready signal is asserted over a period of multiple commands.

20 Claims, 10 Drawing Sheets

(56) References Cited

U.S. PATENT DOCUMENTS

| | | |
|---|---|---|
| 5,615,355 A | 3/1997 | Wagner |
| 6,356,473 B1 | 3/2002 | Shimoyama |
| 6,519,187 B2 | 2/2003 | Wada |
| 6,892,237 B1 | 5/2005 | Gai et al. |
| 6,958,940 B2 | 10/2005 | Takase et al. |
| 7,631,023 B1 | 12/2009 | Kaiser et al. |
| 8,880,831 B2 | 11/2014 | Krishnan et al. |
| 2002/0018395 A1 | 2/2002 | McLaury |
| 2003/0041216 A1 | 2/2003 | Rosenbluth et al. |
| 2003/0046488 A1 | 3/2003 | Rosenbluth et al. |
| 2006/0007737 A1 | 1/2006 | Takase et al. |
| 2006/0041799 A1 | 2/2006 | Sato |
| 2008/0279002 A1 | 11/2008 | Lee |
| 2013/0262779 A1 | 10/2013 | Bobba et al. |
| 2014/0181433 A1 | 6/2014 | Pfeffer et al. |
| 2014/0310441 A1 | 10/2014 | Klughart |
| 2015/0012684 A1 | 1/2015 | Avila et al. |
| 2016/0140034 A1 | 5/2016 | Meyuhas | ns).

ACTIVE RANDOM ACCESS MEMORY

CROSS-REFERENCE TO RELATED APPLICATIONS

The present application is a continuation of U.S. patent application Ser. No. 15/341,372, filed Nov. 2, 2016, which claims priority to U.S. Provisional Patent Application No. 62/337,421, filed May 17, 2016, entitled "Systems and Methods for High Speed SRAM Interaction Using Handshake or Response," which is incorporated herein by reference in their entirety.

BACKGROUND

Semiconductor devices are often limited by their slowest path. That is, if a semiconductor device can perform a type of operation in a range of execution periods of time, depending on the circumstances of that operation (e.g., a memory read operation takes 0.4 ns in one circumstance but 0.9 ns in another), then the specification for that semiconductor is typically limited by the slowest execution time of that range (e.g., all read operations are expected to be completed in 0.9 ns).

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
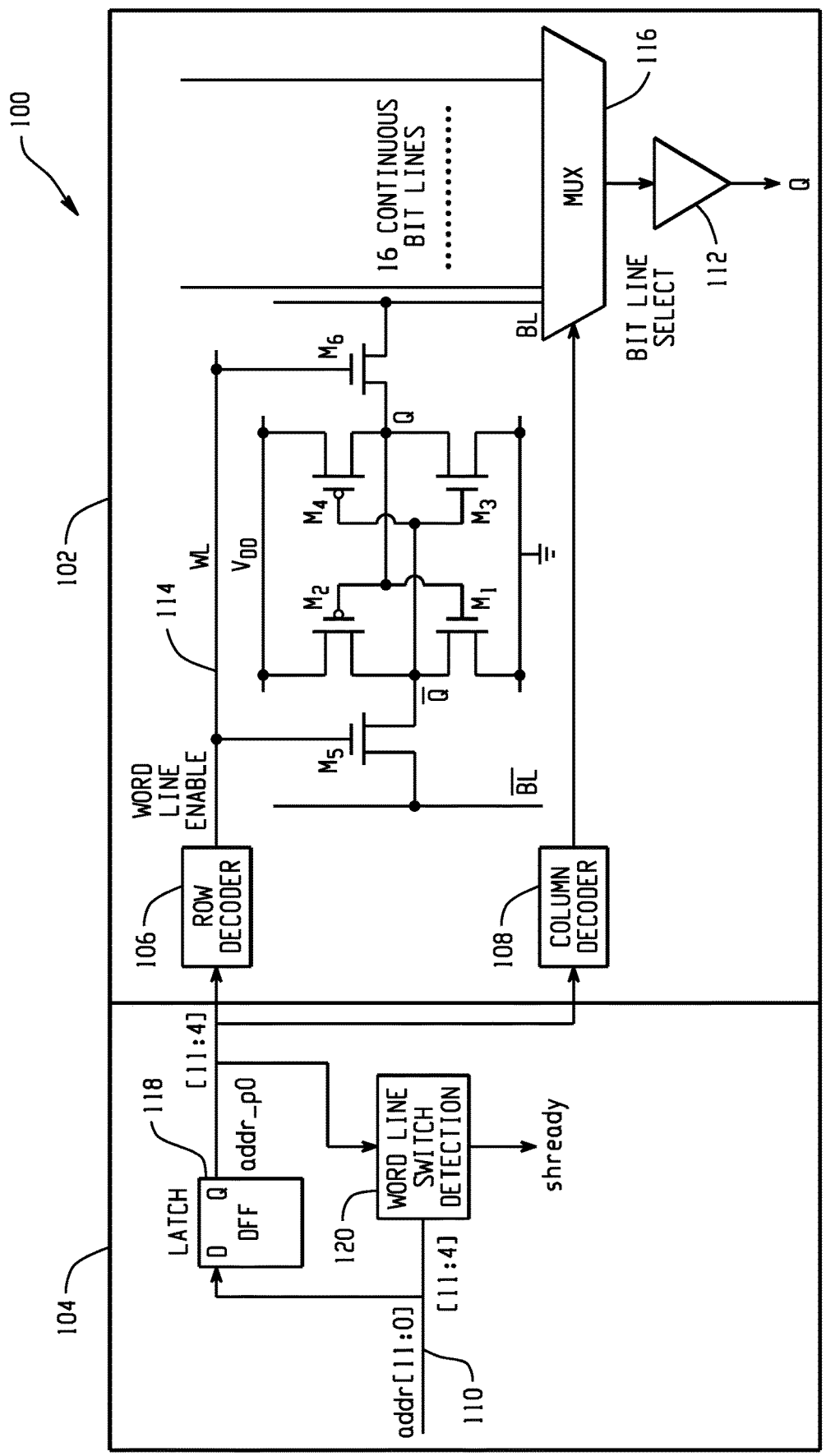
FIG. 1 is a diagram depicting a random access memory read path that includes pattern detection circuitry, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Systems and methods as described herein provide random access memories that can identify circumstances where operations can be performed in less than worst case time for a type of operation. For example, where a worst case read operation takes 0.94 ns and a best case read operation takes 0.34 ns, the random access memory can detect when a current read operation will be a fast read operation and can indicate to external entities that a next operation can be sent immediately.

FIG. 1 is a diagram depicting a random access memory read path that includes pattern detection circuitry. The random access memory 100 (e.g., a static random access memory (SRAM)) includes read circuitry 102 and pattern matching circuitry 104 for identifying when read commands can be performed faster than a worst case time period. The read circuitry 102 includes a row decoder 106 and a column decoder 108 used to select a row and column of data to be read from the memory 100 based on an address inputted to the pattern detection circuitry 104 at 110. In the example of FIG. 1, a 12 bit address is provided to the memory 100 at point 110 to select a byte of memory to be read from the memory and outputted at 112. The 8 high order bits of that address are provided to the row decoder to select a row containing a word of interest from the storage cells 114 of the memory 100. The 4 low order bits are provided to the column detector 108 to select a byte from a selected row for output at 112 via multiplexer 116.

In certain implementations, read commands appearing as an address at the row and column decoders 108 can take different amounts of time to complete depending on the circumstances. For example, certain lag is introduced into a series of consecutive read operations when the byte being read in a current read operation is different than the byte read in a previous read operation. This lag results from the need for the column decoder 106 to decode the high order address bits indicating the row/word where the desired byte of data is located, select the row of memory in the memory cells 114, and copy that word of data to the multiplexer 116 input. This lag is not present in instances where read operations consecutively read from the same row/data word. There, the selected data word remains in the multiplexer 116, and the desired byte is selected via the bottom order address bits inputted to the column decoder 108 to generate a selection signal to the multiplexer 116. In one experiment, the best case data read access time, when data is read consecutively from a common word, was 0.34 ns, while the worst case data read time where data in consecutive reads is from different data words is 0.94 s.

Typical systems operate according to the worst case operation time. Thus, for a memory having a worst case read time of 0.94 ns, a specification for that memory would traditionally state that read operations cannot be performed faster than that worst case time (e.g., a specification would state that read operations cannot be received faster than one per 1.0 ns). The pattern detection circuitry 104 of FIG. 1 enables the memory to output a signal (shready) indicating to entities within or external to the memory 100 that the memory 100 is ready to receive a next command faster than the worst case timing.

In the example of FIG. 1, the pattern detection circuitry 104 includes a latch 118 and a comparator 120. The comparator 120 is configured to compare the high order address bits received with read commands at 110 to determine if a word being accessed in a current read operation is the same word that was accessed in a prior read operation. The comparator receives the 8 high order address bits for the current read operation from 110 and the 8 high order bits from the immediately prior read operations from the latch at 118. If those high order bits match, then the read operations are accessing the same word in the memory cells 114, and the current read operation will occur faster than the worst case timing. The comparator 120 asserts the shready signal, actively indicating (e.g., to an external master circuit) that a next read operation can be sent quickly, because the current read operation will be completed faster than the worst case time. The current read address is provided to the latch 118 for use in a next pattern detection operation. As an alternative to use of the shready signal, upon sending read commands that request data from two different data words, an external master circuit could, on its own, wait a predetermined number of one or more clock cycles before sending a next read command.

Figure 2:
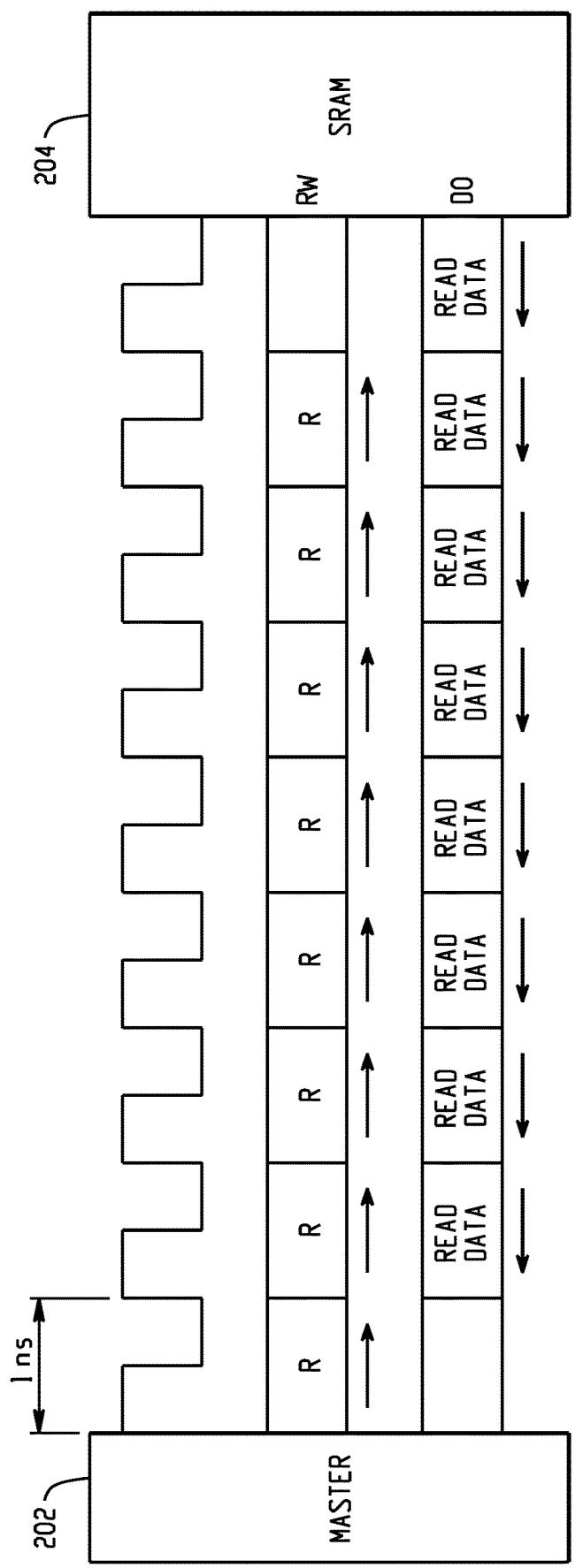
FIG. 2 is a timing diagram indicating one mechanism for handling transmission of read commands to a conventional memory that completes read operations in differing times.

FIG. 2 is a timing diagram indicating one mechanism for handling transmission of read commands to a memory that completes read operations in differing (e.g., between a best case and a worst case time) times. In the example of FIG. 2, a 1 ns clock that is slower than the worst case timing is used. Read commands are consistently sent from a master device 202 to the SRAM 204 1 ns apart, and read data is returned in 1 ns increments. The mechanism of FIG. 2 results in sixteen read operations being performed in 17 ns regardless of whether the data being read is from one or sixteen different data words.

Figure 3:
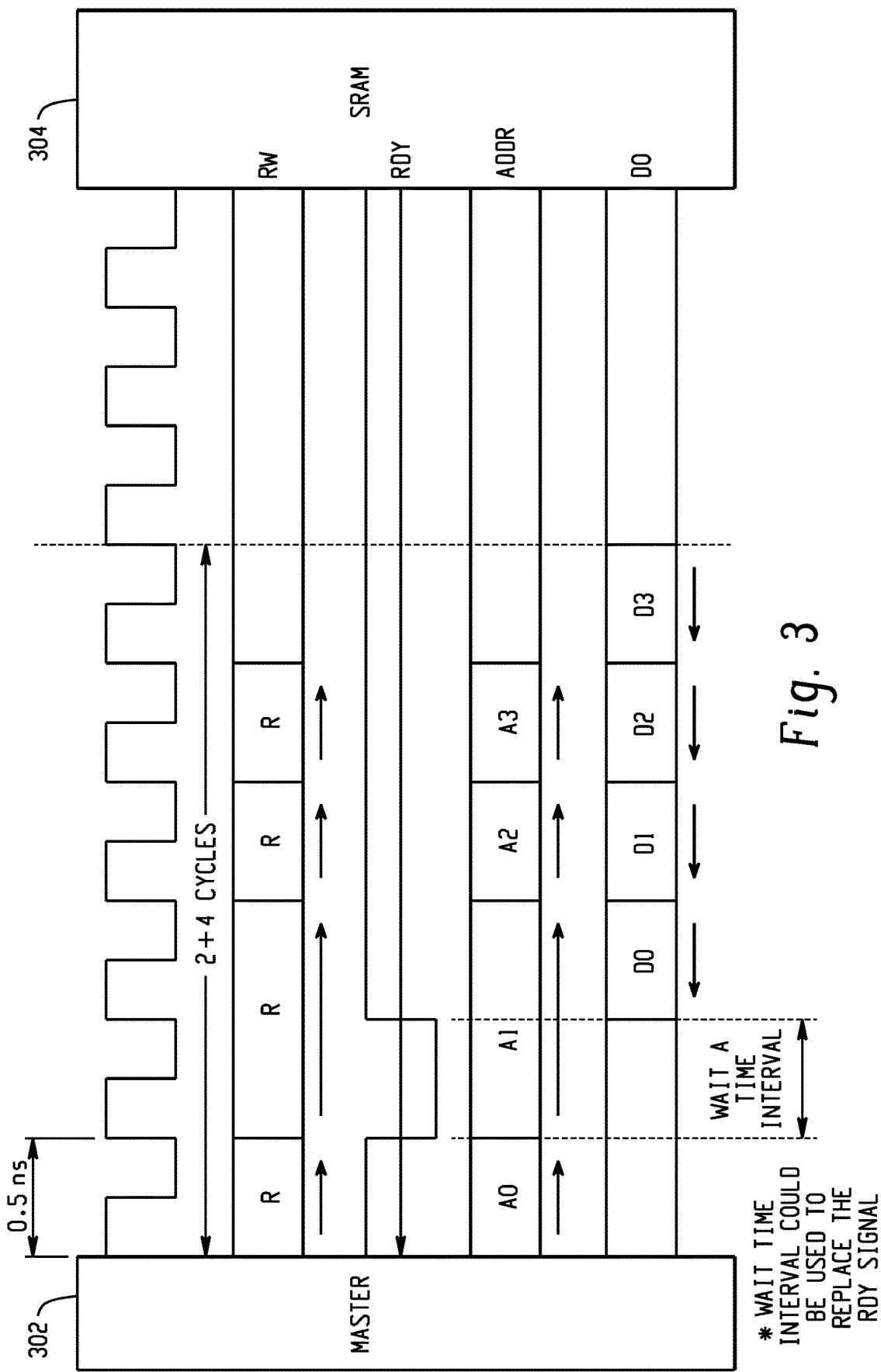
FIG. 3 is an example of a second mechanism for transmitting read commands that takes advantage of pattern detection circuitry in a memory, in accordance with some embodiments.

FIG. 3 is an example of a second mechanism for transmitting read commands that takes advantage of pattern detection circuitry in a memory. In the example of FIG. 3, a clock having a period of 0.5 ns is used. This clock is faster than the time necessary to perform a worst case read of 0.94 ns. Read commands cannot, thus, be blindly sent by the master device 302 at a 0.5 ns rate, as worst case reads would not complete before a next read command was received by the SRAM 304, causing a conflict or crash. The SRAM, thus, uses a ready signal (RDY) to indicate when read operations will be performed quickly (e.g., at the 0.34 ns rate) and that the master device 302 should send a next read operation promptly during the next 0.5 ns clock cycle.

In the example of FIG. 3, a first read request (R) and corresponding address (A0) is sent during the first 0.5 ns clock cycle. Because the high order address bits for that read indicate a data word that has not already been loaded (e.g., into the multiplexer 116 of FIG. 1), the pattern matching circuitry does not indicate a match, and the RDY signal is pulled low for one clock cycle, allowing the SRAM to perform the worst case (0.94 ns) read operation. Accordingly, the master device 302 asserts a next read request and corresponding address (A1) over a two clock cycle (i.e., 1.0 ns) time period. In the example of FIG. 3, that second read request requests a byte (or multiple bytes) of data from the same word as the first read request. The pattern matching circuitry detects a match between the high order bits of the first read request address (A0) and the second read request address (A1) and outputs a high RDY signal indicating that the current read request will be performed quickly. The high RDY signal informs the master device 302 that a third read request and corresponding address (A2) can be sent a mere one clock cycle (0.5 ns) later. When that third read request's address (A3) has common high order address bits as the second request's address, the pattern matching circuitry continues to assert the RDY signal high indicating a fast read operation, and the fourth read request can be sent immediately during the next 0.5 ns clock cycle. As indicated in FIG. 3 and described above, as an alternative to use of the RDY signal, upon sending consecutive read commands that request data from two different data words, the master 302 could, on its own, wait a predetermined number of one or more clock cycles before sending a next read command.

Thus, the example timing of FIG. 3, enabled by the pattern matching circuitry and the corresponding signaling of the RDY signal enables sixteen consecutive read operations from the same row or data word to be performed in 9 ns, compared to 17 ns in the example of FIG. 2.

Figure 4:
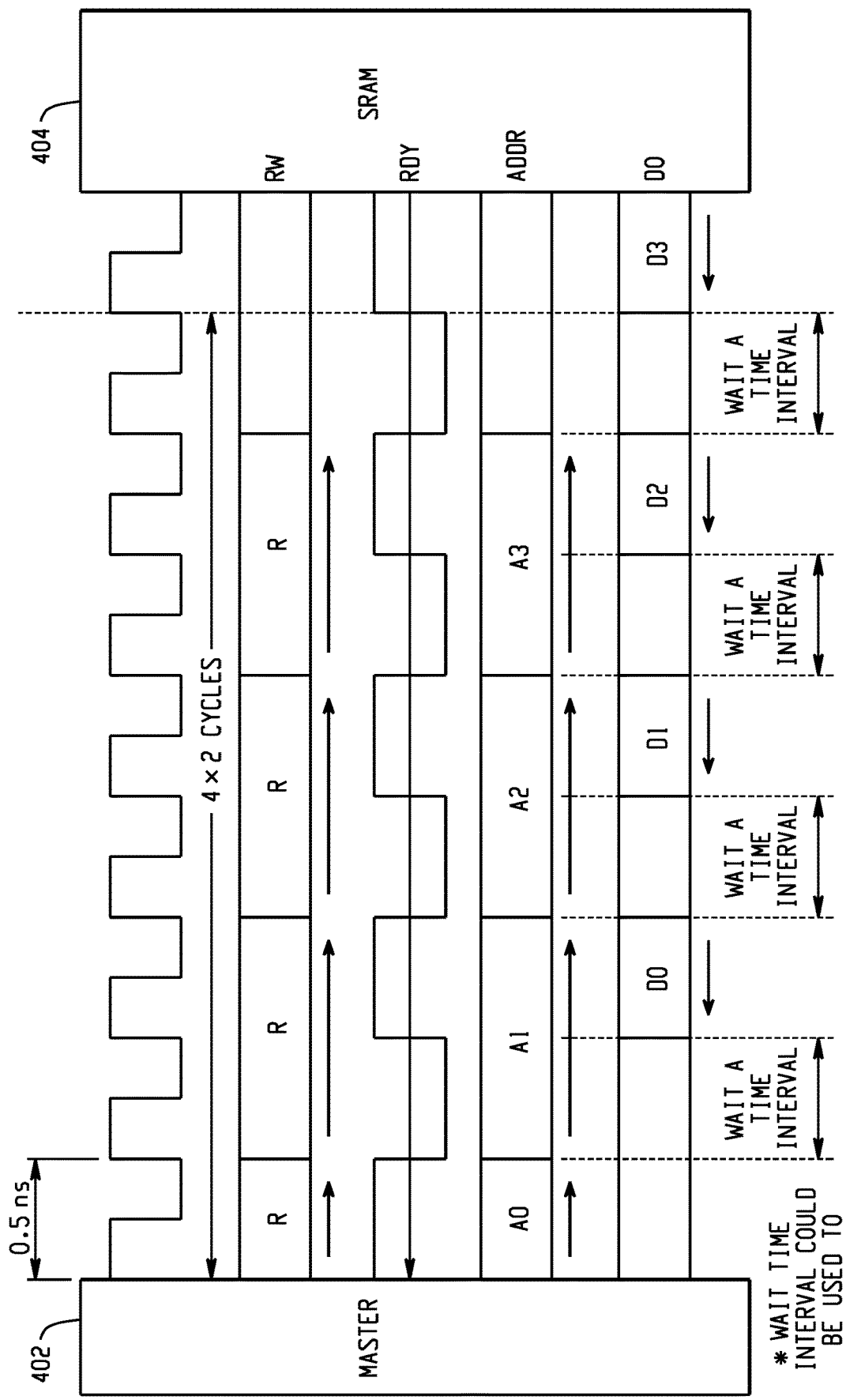
FIG. 4 is a diagram depicting read operation performance of a memory that includes pattern matching circuitry under a worst case scenario.

FIG. 4 is a diagram depicting performance of a memory that includes pattern matching circuitry under a worst case scenario. In the example of FIG. 4, each read request asks for data from a different data word, requiring loading of a new data word(s) into the multiplexer. Thus, each time the pattern matching circuitry compares the high order address bits from a current read operation to the high order address bits from an immediate prior read operation, no match is found and the pattern matching circuitry pulls the RDY signal low for one 0.5 ns clock cycle. (In one embodiment, the master device asserting the same address (e.g., A1) for two clock cycles results in the comparator (e.g., an AND-gate) of the pattern matching circuitry pulling the RDY signal high for the second clock cycle indicating to the master device 402 that a next command can be sent.) Even in a worst case scenario, as depicted in FIG. 4, sixteen read operations can be performed in 16.5 ns—better than the 17 ns necessary in the example of FIG. 2. Again as indicated in FIG. 4, as an alternative to use of the RDY signal, upon sending consecutive read commands that request data from two different data words, the master 402 could, on its own, wait a predetermined number of one or more clock cycles before sending a next read command.

Figure 5A:
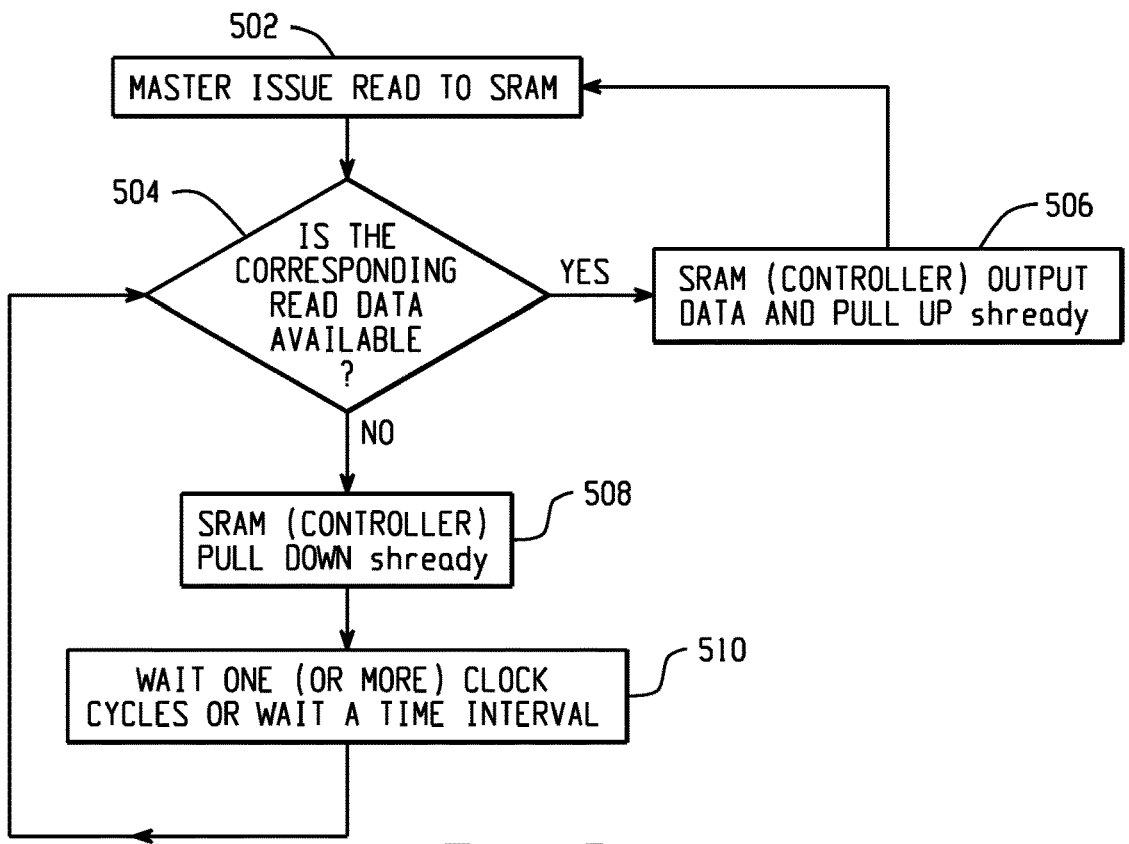
FIGS. 5A and 5B are flow diagrams depicting example processes that utilize a ready signal or waiting a time interval to control read operations of a memory, respectively, in accordance with some embodiments.
Figure 5B:
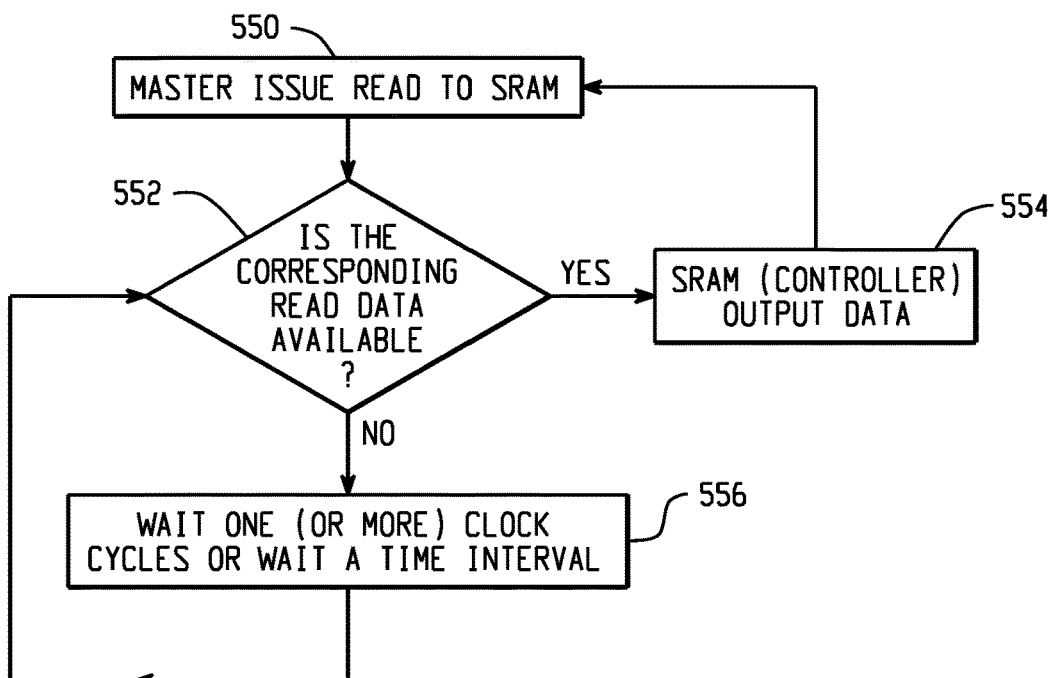

FIGS. 5A and 5B are flow diagrams depicting an processes for controlling a ready signal of a memory. FIGS. 5A and 5B are described with reference to FIG. 1 for context, but the methods are applicable to other structures as well. In the example of FIG. 5A, at 502 a master device issues a read command to the memory received at 110. At 504, a determination is made by pattern detection circuitry 104 as to whether the current read operation will be a fast operation (e.g., the word that is to be read from is already present in the multiplexer). If so, then the ready signal is asserted at 506 (e.g., by pulling up the shready signal at 120), the SRAM read circuitry 102 outputs data, and a next read command can be received at 110, as indicated back at 502. If not, the ready signal is deasserted at 508 (e.g., by pulling down the shready signal at 120) for one or more clock cycles, as indicated at 510.

In the example of FIG. 5B, at 550 a master device issues a read command to the memory received at 110. At 552, a determination is made by pattern detection circuitry 104 as to whether the current read operation will be a fast operation (e.g., the word that is to be read from is already present in the multiplexer). If so, then the SRAM outputs data at 554 and a next read command can be received at 110, as indicated back at 550. If not, the SRAM and the master device wait for one or more clock cycles (e.g., a predetermined period of time, as indicated at 556). The master device, knowing that it had sent consecutive read commands that would take longer than one cycle to complete (e.g., by requesting data from a different data word than an immediately prior request) waits a predetermined one or more clock cycles before sending a next read command to be received at 110.

Figure 6:
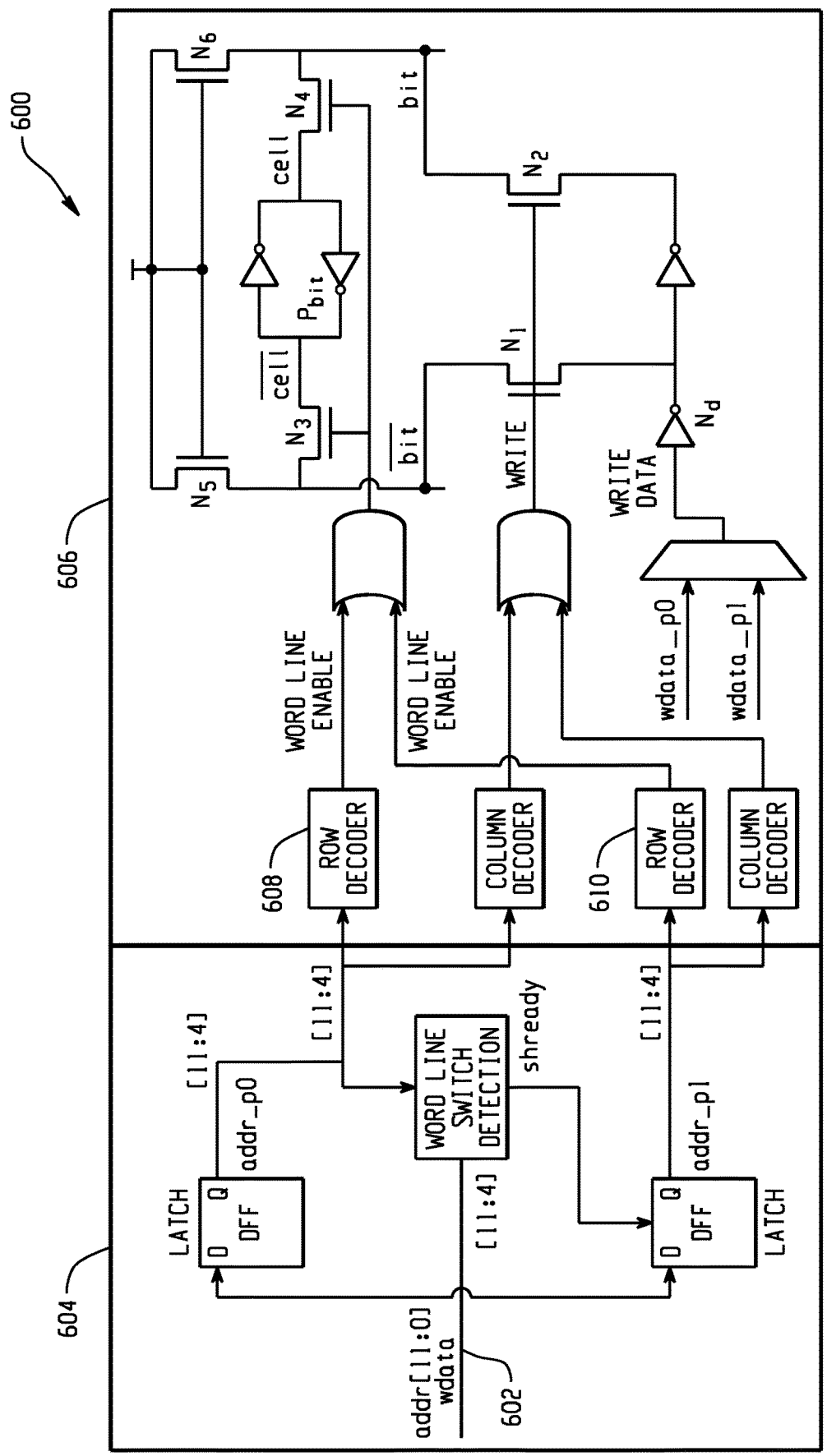
FIG. 6 is a diagram depicting a memory that includes a second, parallel write path and pattern detecting circuitry, in accordance with some embodiments.

Similar benefits can be achieved for write operations. In a data write operation, a specific row of a memory containing a word of data is accessed and overwritten. In instances where a common row and word are written to sequentially, subsequent write operations will take less time. In one example, a first write operation to a row takes 0.99 ns, while a subsequent write of a byte to that same row takes 0.77 ns. FIG. 6 is a diagram depicting a memory 600 that includes a second, parallel write path and pattern detecting circuitry that can take advantage of such disparate operation timing.

In the example of FIG. 6, an address associated with a write operation is received at 602 at the input of pattern matching circuitry 604. Addresses associated with write operations are alternatingly transmitted to one of two parallel write paths in write circuitry 606. A first write path includes a first row decoder and first column decoder, as indicated at 608, and a second write path includes a second row decoder and second column decoder, as indicated at 610. When operating in a best case scenario (e.g., 0.77 ns consecutive writes to bytes in a common word), the memory 600 can receive and process write operations, alternatingly using the two write paths 608, 610, using a 0.5 ns clock. When consecutive writes by a write path are not to the same row/word, the write operation cannot be completed in sufficient time. Thus, a write command will need to be delayed one 0.5 ns clock cycle in such circumstances.

Pattern detecting circuitry 604 facilitates detection of whether fast write operations can be completed based on successive writes to a common data word. The write circuitry 604 includes two latches which enable storage of at least the high order bits of a prior write operation for a given write path. A comparator compares the high order bits (e.g., address bits 11:4) of a current write command with those of an immediate prior write command on the assigned write path to see whether the same data word is being accessed for writing. If so, the shready signal is asserted (e.g., externally to the memory 600) to actively signal that a next write command can be immediately received. If a match is not detected (i.e., a current write command is writing to a different data word), then the shready signal is not asserted, indicating that the next write command should be held for at least one clock cycle.

Figure 7:
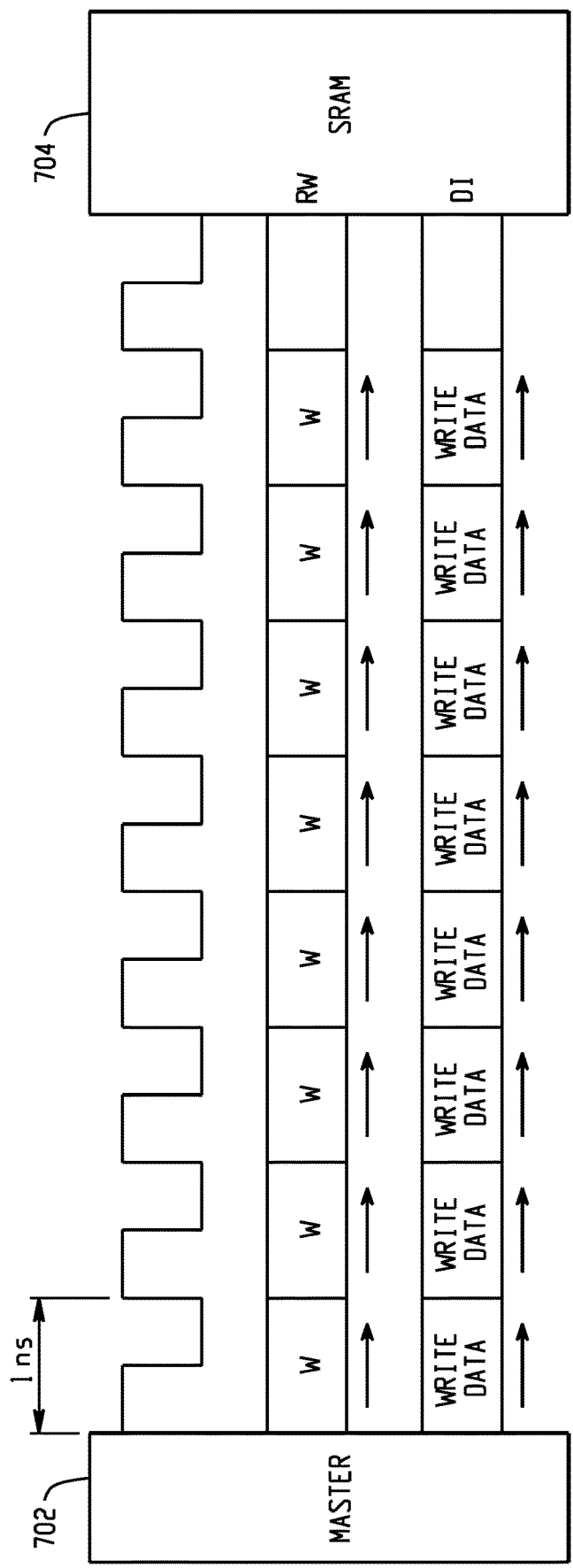
FIG. 7 is a timing diagram indicating one mechanism for handling transmission of write commands to a conventional memory that completes write operations in differing times.

FIG. 7 is a timing diagram indicating one mechanism for handling transmission of write commands to a memory that completes write operations in differing (e.g., between a best case and a worst case time) times. In the example of FIG. 7, a 1 ns clock that is slower than the worst case timing is used. Write commands are consistently sent from a master device 202 to the SRAM 204 1 ns apart along with data to be written. The mechanism of FIG. 7 results in sixteen write operations being performed in 16 ns regardless of whether the data is being written to one or sixteen different data words.

Figure 8:
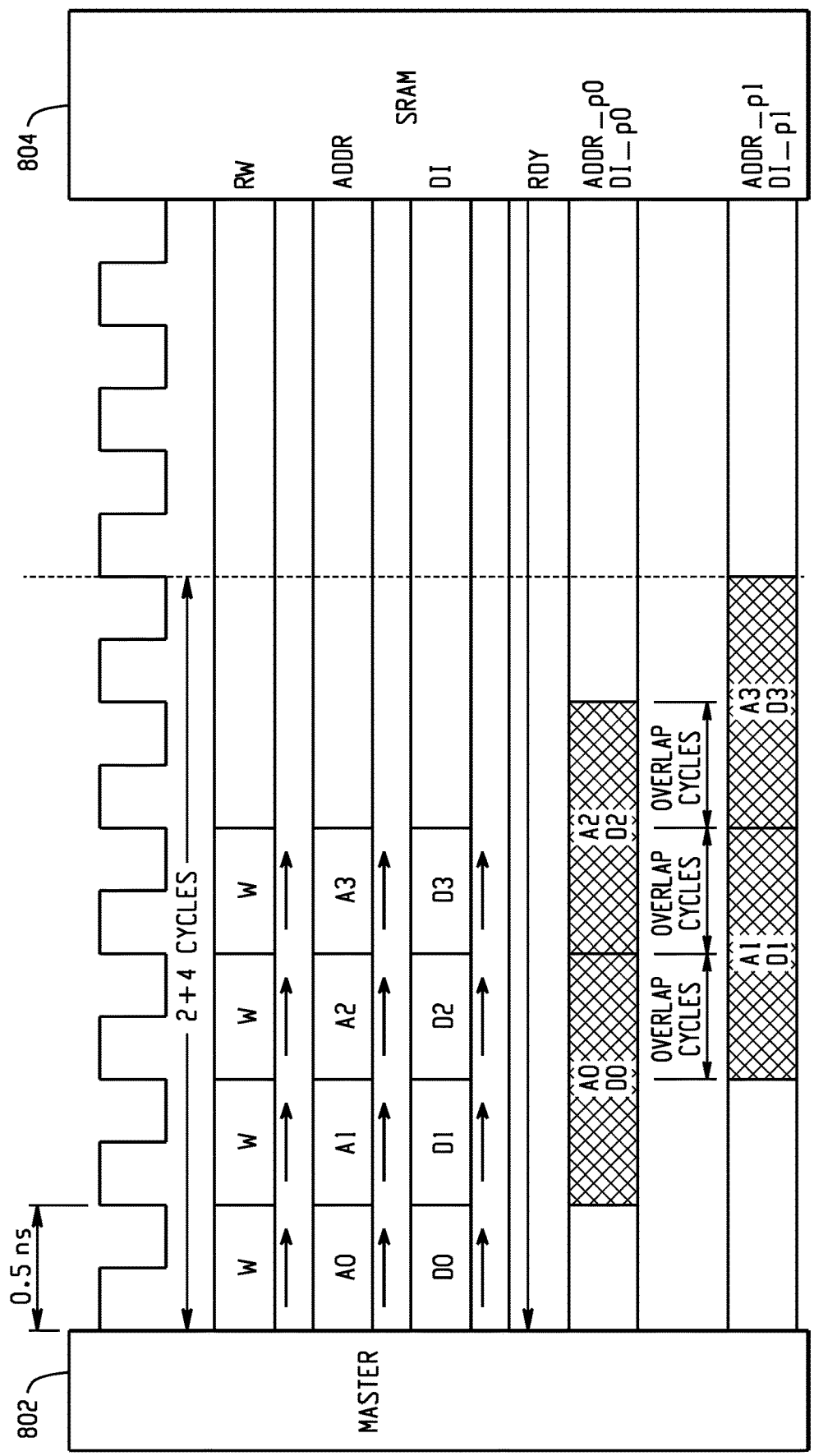
FIG. 8 is a timing diagram illustrating a second mechanism for transmitting write commands that takes advantage of pattern detection circuitry in a memory.

FIG. 8 is a timing diagram illustrating a second mechanism for transmitting write commands that takes advantage of pattern detection circuitry in a memory. In the example of FIG. 8, a clock having a period of 0.5 ns is used. A write command (W) is transmitted from a master device 802 to an SRAM along with an address (A0) and data (A1) to be written in a first clock cycle. That write command is issued to a first of the two parallel write paths. A second write command is transmitted from the master device 802 during a second clock cycle that includes an associated address (A1) and data (D1). This write command is issued to a second of the two parallel write paths. A third write command and associated address (A2) and data (D2) is sent to the SRAM and is assigned to the first write path. Pattern checking circuitry compares the high order bits of the addresses (A0, A2) of the two write commands for the first write path to determine whether the commands seek to write data to the same row/data word. Because they do, a match is determined, and the RDY signal from the SRAM 804 to the master device 802 is held high. This indicates to the master device 802 that a next write command can be sent immediately, in the fourth clock cycle. A fourth write command and associated address (A3) and data (D3) is then sent to the SRAM. In this best case scenario, where data is repeatedly written to a common data word, sixteen data write operations can be performed in 9 ns, compared with the 16 ns necessary in the implementation of FIG. 7.

Figure 9:
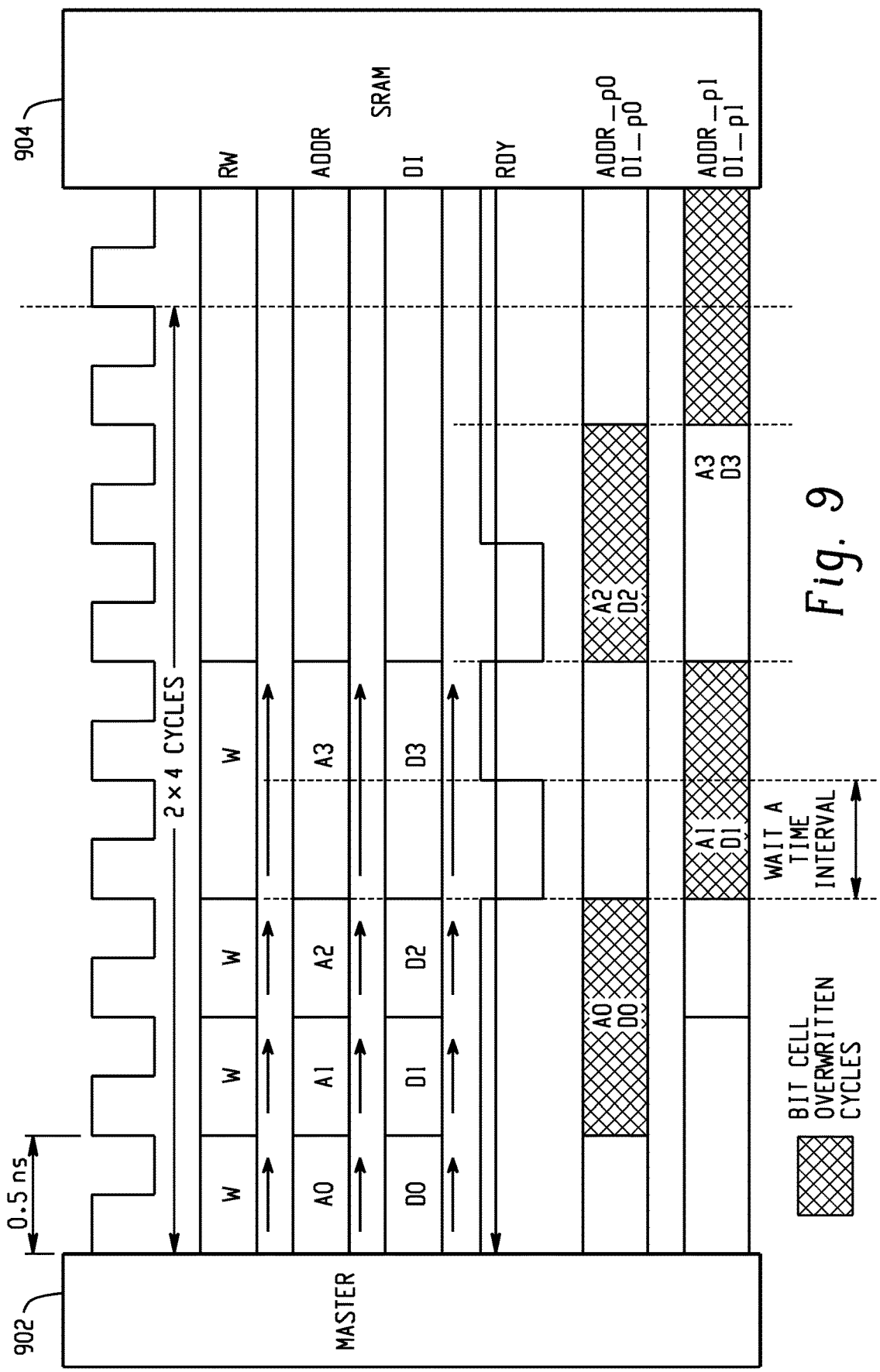
FIG. 9 is a diagram depicting performance of a memory that includes pattern matching circuitry under a worst case scenario.

FIG. 9 is a diagram depicting performance of a memory that includes pattern matching circuitry under a worst case scenario. In the example of FIG. 9, when a third write command is received along with its associated data (D2) and address (A2) from the master device 902, the pattern matching circuitry detects that the third write command is not writing to the same data word as the first write command on the first write path. Thus, the next write command will not be performed in the best case scenario time, instead taking close to 0.99 ns to complete. The pattern detecting circuitry of the memory 904 deasserts the RDY signal for the fourth clock cycle, indicating to the master device 902 to hold the fourth write command for an additional clock cycle. As indicated in FIG. 9, as an alternative to using the RDY signal to inform the master device 902 that the master device 902 should wait, the master device 902 can determine, based on its sending consecutive write commands that reference bytes in different data words, that the master device 902 should wait a predetermined one or more clock cycles on its own, before sending (or deasserting) a next write command.

Figure 10A:
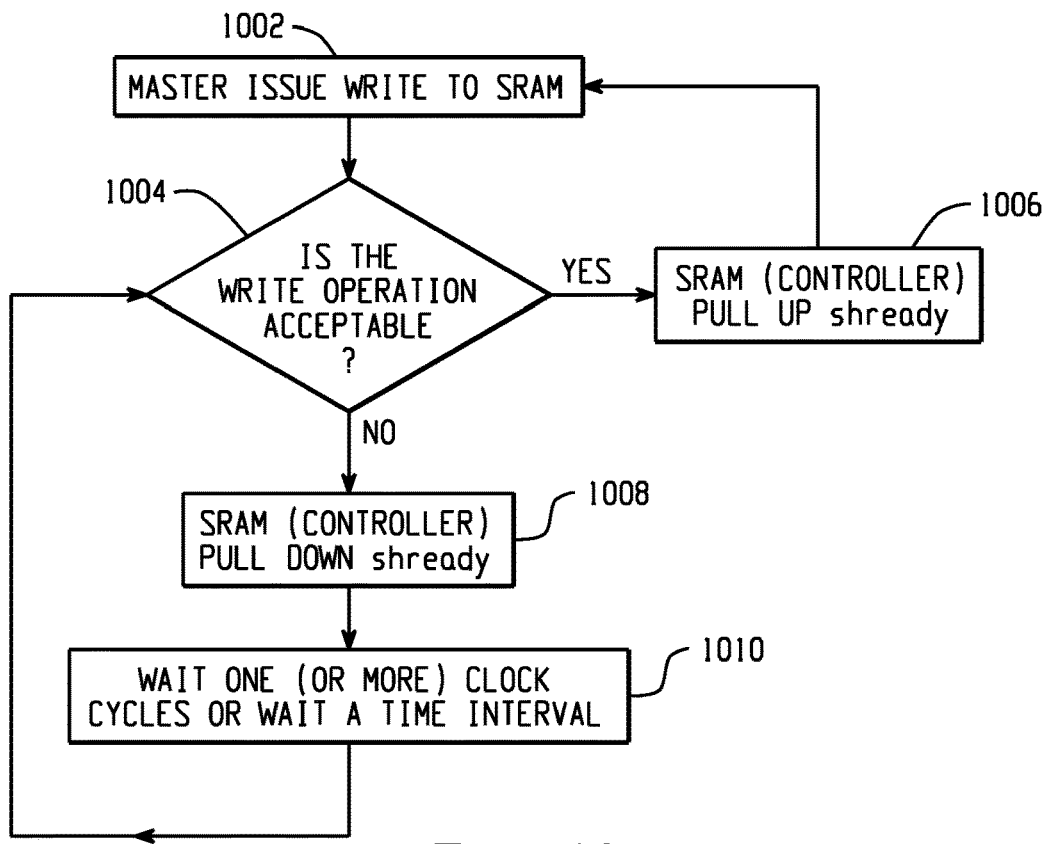
FIGS. 10A and 10B are flow diagrams depicting example processes that utilize a ready signal or waiting a time interval to control write operations of a memory, in accordance with some embodiments.
Figure 10B:
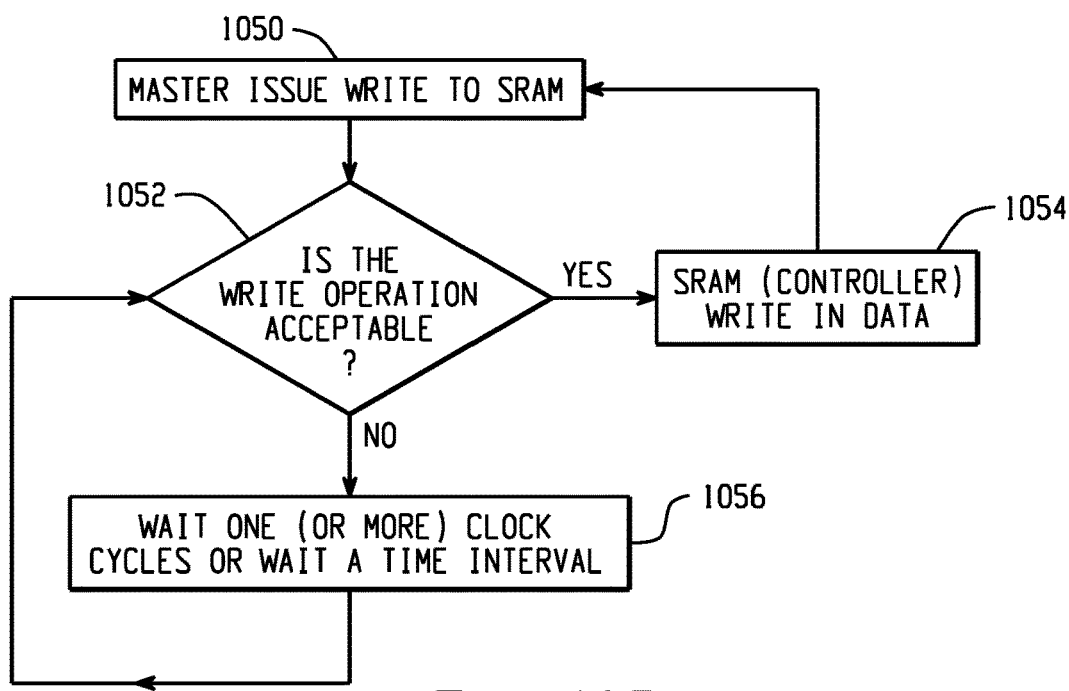

FIGS. 10A and 10B are flow diagrams depicting example processes for controlling a ready signal of a memory during write operations. FIGS. 10A and 10B are described with reference to FIG. 6 for context, but the methods are applicable to other structures as well. In the example of FIG. 10A, at 1002 a master device issues a write command to the memory, which is received at 602. At 1004, a determination is made by pattern matching circuitry 604 as to whether the current write operation will be a fast operation (e.g., the word that is to be written to was written to in a previous write operation). If so, then the data signal is written to the SRAM, the ready signal is asserted at 1006, and a next write command can be received at 602, as indicated back at 1002. If not, the ready signal is deasserted at 1008 for one or more clock cycles, as indicated at 1010.

In the example of FIG. 10B, at 1050 a master device issues a write command to the memory, which is received at 602. At 1052, a determination is made by pattern matching circuitry 604 as to whether the current write operation will be a fast operation (e.g., the word that is to be written to was written to in a previous write operation). If so, then the data is written to the SRAM at 1006 and a next write command can be received back at 1002. If not, the ready signal is deasserted at 1008 for one or more clock cycles, as indicated at 1010. If not, the SRAM and the master device wait for one or more clock cycles (e.g., a predetermined period of time, as indicated at 1056). The master device, knowing that it had sent consecutive write commands that would take longer than one cycle to complete (e.g., by writing data to a different data word than an immediately prior request) waits a predetermined one or more clock cycles before sending a next write command to be received at 602.

The present disclosure is directed to systems and methods for processing commands at a random access memory. A series of commands are received to read data from the random access memory or to write data to the random access memory. The random access memory can process commands at a first rate when the series of commands matches a pattern, and at a second, slower, rate when the series of commands does not match the pattern. A determination is made as to whether the series of commands matches the pattern based on at least a current command and a prior command in the series of commands. A ready signal is asserted when said determining determines that the series of commands matches the pattern, where the random access memory is configured to receive and process commands faster than the second rate when the pattern is matched and the ready signal is asserted over a period of multiple commands.

As another example, a random access memory includes a plurality of data cells arranged in rows and columns. Command receiving circuitry is configured to receive a series of commands to read data from the random access memory or to write data to the random access memory, where the random access memory can process commands at a first rate when the series of commands matches a pattern, and where the random access memory can process commands at a second, slower, rate when the series of commands does not match the pattern. Pattern detection circuitry is configured to determine whether the series of commands matches the pattern, where the pattern detection circuitry is configured to assert a ready signal from an interface of the random access memory when the series of commands matches the pattern, the ready signal informing external entities that the random access memory can receive commands at the first rate.

As a further example, a system includes a master device operating at a first clock rate. A random access memory is configured to receive commands from the master device, where the random access memory is capable of responding to data read commands matching a pattern at a first rate that is at least as fast as the first clock rate, and where the random access memory cannot respond to data read commands that do not match the pattern as fast as the first clock rate. The random access memory comprises pattern matching circuitry configured to determine whether received read commands match the pattern based on at least a current read command and an immediate prior read command, where the random access memory outputs a ready signal indicating to the master device that the random access memory can receive read commands at the first clock rate when the pattern matching circuitry determines a match.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method, comprising:
  receiving a series of commands to read data from a random access memory or to write data to the random access memory, wherein each read or write command includes an address of a location where the data to be read is stored or where the data is to be written in the random access memory, wherein the random access memory can process commands at a first rate when the series of commands matches a pattern, and wherein the random access memory can process commands at a second, slower, rate when the series of commands does not match the pattern;
  determining whether the series of commands matches the pattern based on at least a current command and a prior command in the series of commands, wherein the series of commands matches the pattern when a portion of the address of the current command matches the same portion of the address of the prior command; and
  asserting a ready signal when said upon determining that the current command can be processed at the first rate,
  wherein, when the ready signal is asserted, the random access memory is configured to receive and process begin processing a next command upon processing the current command at the first rate instead of waiting until the current command is processed at the second, slower rate.

2. The method of claim 1, wherein each address comprises a high order portion and a low order portion, wherein the series of commands matches the pattern when the high order portion of the current command matches the high order portion of an immediately prior command.

3. The method of claim 2, wherein the high order portion is associated with a data word, and wherein the low order portion is associated with one or more data bytes.

4. The method of claim 1, wherein the series of commands are read commands, wherein the first rate is associated with a shorter delay in accessing data from a data word in the memory multiple times consecutively, wherein the second rate is associated with a longer delay in accessing data from different data words in consecutive read operations, and wherein the random access memory is configured to receive and begin processing a next command after a shorter delay when the ready signal is asserted.

5. The method of claim 1, wherein the series of commands are write commands, wherein the first rate is associated with a shorter delay in writing data to a data word in the memory multiple times consecutively, wherein the second rate is associated with a longer delay in writing data to different data words in consecutive write operations, and wherein the random access memory is configured to receive and begin processing a next command after a shorter delay when the ready signal is asserted.

6. The method of claim 1, wherein said determining comprises:
  receiving an address associated with an immediately prior command from a delay circuit;
  providing the portion of the address associated with the current command to the delay circuit and a comparator circuit; and determining whether the portion of the address from the immediately prior command matches the portion of the address from the current command.

7. The method of claim 6, further comprising outputting an early ready signal from the random access memory when the portion of the address from the immediately prior command matches the portion of the address from the current command.

8. A random access memory, comprising:
a plurality of data cells arranged in rows and columns;
command receiving circuitry configured to receive a series of commands to read data from the random access memory or to write data to the random access memory, wherein each read or write command includes an address of a location where the data to be read is stored or where the data is to be written in the random access memory, wherein the random access memory can process commands at a first rate when the series of commands matches a pattern, and wherein the random access memory can process commands at a second, slower, rate when the series of commands does not match the pattern;
pattern detection circuitry configured to determine whether the series of commands matches the pattern, wherein the series of commands matches the pattern when a portion of the address of a current command matches the same portion of the address of a prior command; and
wherein the pattern detection circuitry is configured to assert a ready signal from an interface of the random access memory when the series of commands matches the pattern, the ready signal informing external entities that the random access memory can receive and begin processing a next command upon processing the current command at the first rate instead of waiting until the current command is processed at the second, slower rate.

9. The memory of claim 8, wherein the pattern detection circuitry comprises:
a delay circuit; and
a comparator.

10. The memory of claim 9, wherein the comparator is configured to receive a portion of the address associated with an immediately prior command from the delay circuit and the portion of the address associated with the current command from the command receiving circuit;
wherein the portion of the address for the current command is transmitted to the delay circuit;
wherein the comparator is configured to output a signal indicating whether the portion of the address for the immediately prior command matches the portion of the address for the current command.

11. The memory of claim 8, wherein the series of commands are read commands, wherein the first rate is associated with a shorter delay in accessing data from a row in the memory multiple times consecutively, wherein the second rate is associated with a longer delay in accessing data from different rows in consecutive read operations, and wherein the random access memory is configured to receive and begin processing a next command after a shorter delay when the ready signal is asserted.

12. The memory of claim 8, wherein the series of commands are write commands, wherein the first rate is associated with a shorter delay in writing data to a row in the memory multiple times consecutively, wherein the second rate is associated with a longer delay in writing data to different rows in consecutive write operations, and wherein the random access memory is configured to receive and begin processing a next command after a shorter delay when the ready signal is asserted.

13. The memory of claim 12, wherein the memory further comprises two parallel write paths;
wherein the first rate is associated with a first period;
wherein neither of the parallel write paths are capable of writing data to cells of the memory in a shorter time than the first period.

14. The memory of claim 13, wherein a first parallel write path includes a first row decoder and a first column decoder, and wherein a second parallel write path includes a second row decoder and a second column decoder;
wherein the first parallel write path and the second parallel write path are configured to write data to a common set of data cells.

15. The memory of claim 14, further comprising a write multiplexer, wherein the write multiplexer is configured to alternatingly output write data associated with the first parallel write path and the second parallel write path to the common set of data cells.

16. A system, comprising:
a master device operating at a first clock rate;
a random access memory configured to receive commands from the master device, wherein each command includes an address of a location where data to be read is stored in the random access memory, wherein the random access memory configured to determine whether responding to data read commands matching a pattern at a first rate based on at least as fast as the first clock rate, wherein the random access memory comprises:
pattern matching circuitry configured to determine whether received read commands match the pattern based on at least a current read command and a prior read command, wherein the received read commands match the pattern when a portion of the address of the current read command matches the same portion of the address of the prior read command; and
wherein the random access memory outputs a ready signal indicating to the master device that the random access memory can receive and begin processing a next command upon processing the current command at the first clock rate when the pattern matching circuitry determines a match, instead of waiting until the current command is processed at the second, slower clock rate.

17. The system of claim 16, wherein the commands each include an address comprising a high order portion and a low order portion, wherein the received read commands match the pattern when the high order portion of the address of the current read command matches the high order portion of the address of an immediately prior command.

18. The system of claim 16, wherein the high order portion is associated with a data word, and wherein the low order portion is associated with one or more data bytes.

19. The system of claim 16, wherein the random access memory is capable of responding to data write commands;
wherein the pattern matching circuitry is configured to determine whether received write commands match the pattern based on at least a current write command and an immediately prior write command, wherein the random access memory outputs a ready signal indicating to the master device that the random access memory can receive write commands at the first clock rate when the pattern matching circuitry determines a match.

20. The system of claim 16, wherein the random access memory includes parallel write paths, wherein neither of the parallel write paths, on its own, is capable of writing data at the first clock rate.

* * * * *